United States Patent
Ando

(10) Patent No.: US 7,363,012 B2
(45) Date of Patent: Apr. 22, 2008

(54) TRANSMISSION POWER CONTROL DEVICE AND METHOD THEREOF, COMPUTER PROGRAM FOR TRANSMISSION POWER CONTROL DEVICE, AND RADIO TRANSMITTER

(75) Inventor: Yoshiaki Ando, Tokyo (JP)

(73) Assignee: NEC Corporation, Tokyo (JP)

( * ) Notice: Subject to any disclaimer, the term of this patent is extended or adjusted under 35 U.S.C. 154(b) by 519 days.

(21) Appl. No.: 11/038,263

(22) Filed: Jan. 21, 2005

(65) Prior Publication Data
US 2005/0156669 A1    Jul. 21, 2005

(30) Foreign Application Priority Data
Jan. 21, 2004    (JP)    ............... 2004-012539

(51) Int. Cl.
*H04B 1/04*    (2006.01)
(52) U.S. Cl. .................. 455/69; 455/126; 330/285
(58) Field of Classification Search ............... None
See application file for complete search history.

(56) References Cited

U.S. PATENT DOCUMENTS

| | | | |
|---|---|---|---|
| 4,158,180 A | 6/1979 | Challen | |
| 4,442,407 A | 4/1984 | Apel | |
| 5,497,125 A | 3/1996 | Royds | |
| 6,972,626 B2 * | 12/2005 | Takahashi et al. | 330/279 |
| 7,123,932 B2 * | 10/2006 | Ha | 455/522 |
| 2002/0125945 A1 | 9/2002 | Taylor | |

FOREIGN PATENT DOCUMENTS

| | | |
|---|---|---|
| GB | 2281461 A | 3/1995 |
| JP | 5-175856 A | 7/1993 |
| JP | H11-55131 A | 2/1999 |
| JP | 2001-284998 A | 10/2001 |
| JP | 2002-176368 A | 6/2002 |
| JP | 2003-243995 A | 8/2003 |
| WO | WO 99/31798 A2 | 6/1999 |

\* cited by examiner

*Primary Examiner*—Thanh Cong Le
(74) *Attorney, Agent, or Firm*—Sughrue Mion, PLLC

(57) ABSTRACT

A transmission power control device which amplifies in a driver amplifier 2, and in a power amplifier 4 to which the output from the driver amplifier is inputted, so that the power of a signal to be transmitted may become predetermined target transmission power, detects an electric-current which flows to the power amplifier 4 from a power supply, and adjusts the gain of the driver amplifier 2 based on this detected electric-current.

18 Claims, 10 Drawing Sheets

| Pout(dBm) | Icc(mA) |
|---|---|
| 28.0 | 313.0 |
| 27.0 | 284.0 |
| 26.0 | 255.0 |
| 25.0 | 226.0 |
| 24.0 | 197.0 |
| 23.0 | 135.0 |
| ⋮ | ⋮ |

FIG. 4

HIGH TEMPERATURE

| Pout(dBm) | Icc(mA) |
|---|---|
| 28.0 | 328.0 |
| 27.0 | 299.0 |
| 26.0 | 270.0 |
| 25.0 | 241.0 |
| 24.0 | 212.0 |
| 23.0 | 150.0 |
| . | . |
| . | . |
| . | . |

FIG. 6 A

LOW TEMPERATURE

| Pout(dBm) | Icc(mA) |
|---|---|
| 28.0 | 298.0 |
| 27.0 | 269.0 |
| 26.0 | 240.0 |
| 25.0 | 211.0 |
| 24.0 | 182.0 |
| 23.0 | 120.0 |
| . | . |
| . | . |
| . | . |

FIG. 6 B

TRANSMISSION POWER CONTROL DEVICE AND METHOD THEREOF, COMPUTER PROGRAM FOR TRANSMISSION POWER CONTROL DEVICE, AND RADIO TRANSMITTER

BACKGROUND OF THE INVENTION

1. Field of the Invention

The present invention relates to the field of a control technology of transmission power in a radio-communications apparatus (a radio transmitter), such as a mobile terminal device.

2. Description of the Related Art

In a radio-communications apparatus, such as a mobile terminal device, transmission power required for transmitting a radio signal varies depending on factors, such as the dispersion and the temperature characteristics of built-in components which constitute a radio-communications circuit (a radio transmitter) For this reason, in such radio-communications circuit, an APC (Automatic Power Control) circuit is generally employed.

FIG. 10 is a block diagram showing a circuit configuration of a conventional radio transmitter having the APC function.

In FIG. 10, I and Q signals denote the orthogonal signals to be transmitted. An orthogonal modulator 101 carries out an orthogonal modulation processing to the inputted signals, I and Q, and thereafter supplies them to a driver amplifier 102. The driver amplifier 102 amplifies the output signals from the orthogonal modulator 101 according to a gain setting value designated from a base-band circuit 107. The amplified output signals of the driver amplifier 102 are, after being band-limited in a band-pass filter 103, inputted to a power amplifier 104. The signals amplified in the power amplifier 104 are transmitted as radio signals from an antenna 112 through a coupler 110, an isolator 105, and a band-pass filter 113.

In addition, the isolator 105 suppresses the generating of the characteristic degradation of the power amplifier 104 due to the fact that a part of the output signals of the power amplifier 104 is reflected at the antenna 112.

The coupler 110 splits the output signal of the power amplifier 104 into a signal for the APC, and a signal for a transmission wave generation. The signal for the APC is inputted to a detection circuit 111. The detection circuit 111 converts the inputted signal for the APC to a voltage value by detecting and smoothing by a detector (not shown) which uses a diode and the like. The detected result (the voltage value) in the detection circuit 111 is transferred to a CPU (Central Processing Unit) 108 through the base-band circuit 107.

In a memory 109, a transmission power versus detection table (an APC table, not shown) for carrying out the APC has been stored in advance. Then, the CPU 108 carries out a comparison processing by referring to this APC table based on the informed detection result. In this comparison processing, the CPU 108 compares transmission power (target transmission power) which this device itself originally needs with the present transmission power which the detected result indicates.

Then, the CPU 108, as a result of this comparison processing, if the present transmission power is smaller than the target transmission power, instructs the driver amplifier 102 through the base-band circuit 107 to increase the gain. On the other hand, if the present transmission power is larger than the target transmission power, the CPU 108 instructs the driver amplifier 102 through the base-band circuit 107 to lower the gain.

In the conventional radio transmitter having the APC function, the transmission power is maintained to preset target transmission power by the above-described configuration.

However, in the conventional radio transmitter (FIG. 10) described above, in order to detect the present transmission power, the coupler 110 is provided in the transmission signal line. The coupler 110 has a circuit configuration which splits the output signal of the power amplifier 104 into the signal for the APC and the signal for the transmission wave generation, as described above. For this reason, with the circuit configuration shown in FIG. 10, because this coupler 110 is inserted in the transmission signal line, a loss will be generated. Namely, in the conventional radio transmitter shown in FIG. 10, there is a drawback of inviting a degradation of RF (Radio Frequency) characteristic due to the fact that the coupler 110 is inserted in the transmission signal line.

Incidentally, in Japanese Patent Application Laid-Open No. H11-55131 (Patent Document 1) and Japanese Patent Application Laid-Open No. 2002-176368 (Patent Document 2), the APC function mounted in a mobile terminal device of a mobile communications system is disclosed.

In these Patent Documents 1 and 2, the mobile terminal device, when the present transmission power of the mobile terminal device is detected in order to realize the APC function, detects an electric-current of the power amplifier. Then, in these Documents, bias control of the power amplifier itself is carried out according to the result of the electric-current detection. For this reason, in the circuit configuration according to the Patent Documents 1 and 2, a terminal (a bias control terminal), which sets a control signal for realizing this bias control to the power amplifier, is required (refer to a variable gain IF amplifier 11 shown in FIG. 1 in the Patent Documents 1 and 2).

Incidentally, in the conventional circuit configuration shown in FIG. 10 described above, in order to detect the present transmission power to realize the APC function, the coupler 110 is inserted in the transmission signal line. The generation of the loss, which is a problem in the conventional circuit configuration (FIG. 10), is due to the coupler 110.

Then, in place of the coupler 110 in the conventional circuit configuration shown in FIG. 10 described above, a case of employing an APC method disclosed in the above-described Patent Documents 1 and 2 is considered. In this case, the power amplifier (the variable gain IF amplifier 11) disclosed in the above-described Patent Documents 1 and 2 corresponds to the power amplifier 104 shown in FIG. 10.

However, in the conventional circuit configuration shown in FIG. 10 described above, a control signal to be set to the driver amplifier 102 from the base-band circuit 107 is not only for realizing the APC function. Namely, such control signal is set to the driver amplifier 102 so as to realize an AGC (Auto Gain Control) function, in addition to realize the APC function. This AGC function is a function for controlling the gain of the device itself optimally depending on the electric-field intensity at the time of radio communications to a base station. For this reason, even when the APC method disclosed in the above-described Patent Documents 1 and 2 is employed, in order to leave such AGC function, a line which supplies the AGC control signal from the base-band circuit 107 to the input terminal (a control terminal) of the driver amplifier 102 is needed. In other words, this means, when the APC method which uses the power amplifier is employed instead of using the coupler 110, a new line which supplies the control signal for the APC from the base-band circuit 107 to the power amplifier 104 is needed.

Accordingly, when the APC method described in the above-described Patent Documents 1 and 2 is applied to the circuit configuration of the conventional radio transmitter shown in FIG. 10, it is necessary to newly add a bias control terminal described above to the power amplifier 104 so as to supply the control signal for the APC to the power amplifier 104. This will invite a design modification in the circuit configuration of the conventional radio transmitter shown in FIG. 10, therefore, is not a good idea in terms of cost.

SUMMARY OF THE INVENTION

The present invention has been made in view of the conventional problems described above. The object of the present invention is to provide a transmission power control device which can minimize the loss generated along with the APC function in a transmission signal and a method thereof, a computer program for the transmission power control device, and a radio transmitter.

In order to attain the above-described object, the transmission power control device according to the present invention has the following configuration.

Namely, the transmission power control device, which adjusts to predetermined target transmission power by amplifying the power of a transmission signal by a first amplifier (a driver amplifier 2) and a second amplifier (a power amplifier 4) to which the output from the first amplifier is inputted, provides a control means (CPU (control circuit) 8) to control the gain of the first amplifier (2) based on the electric-current which flows to the second amplifier (4) from a power supply.

In a suitable embodiment, the transmission power control device further provides a first table (an APC table 9A), on which a characteristic between an electric-current which flows to the second amplifier (4) and the output power of the second amplifier has been stored, and the control means (8) controls the gain of the first amplifier (2) according to the result referred to the first table (9A) based on the electric-current which flows to the second amplifier (4).

And also, more preferably, in the above-described configuration, the transmission power control device further provides a second table (an AGC table 9B), on which a characteristic between the output power of the second amplifier (4) and a control voltage set to the first amplifier (2) in order to control the gain of the device itself has been stored, and the control means (8) compares the referred result of the first table (9A) with the target transmission power, and controls the gain of the first amplifier (2) according to the result referred to the second table (9B) based on this comparison result.

In addition, the same object described above is also attained by a transmission power control method which corresponds to the transmission power control device of each configuration described above.

Moreover, the same object described above is also attained by a radio transmitter which provides the transmission power control device of each configuration described above.

Furthermore, the same object described above is also attained by a computer program which realizes the transmission power control device of each configuration or the method thereof, and by a computer-readable storage medium in which the computer program has been stored.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The above and other objects, features and advantages of the present invention will become more apparent from the following detailed description when taken in conjunction with the accompanying drawings wherein:

FIG. 4 is a view exemplifying an APC table 9A showing the output (Pout) versus the electric-current (Icc) characteristic of the power amplifier 4;

FIG. 6A is a view exemplifying an APC table to be referred to at high temperature;

FIG. 6B is a view exemplifying an APC table to be referred to at low temperature;

DETAILED DESCRIPTION OF THE PREFERRED EMBODIMENTS

Hereinafter, a transmission power control device according to embodiments of the present invention will be described in detail by embodiments to which the present invention is applied to a radio transmitter, such as a mobile terminal device, by referring to the accompanying drawings.

Figure 1:
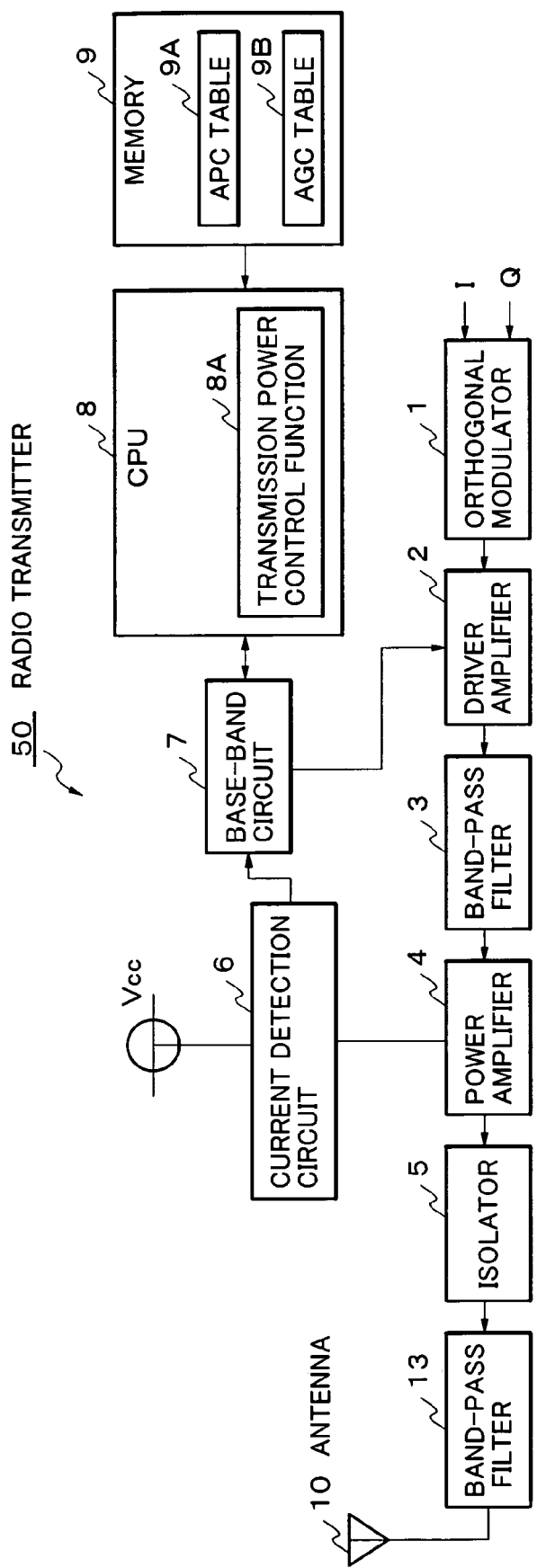
FIG. 1 is a block diagram showing a circuit configuration of a radio transmitter in an embodiment of the present invention.

FIG. 1 is a block diagram showing a circuit configuration of a radio transmitter in an embodiment of the present invention. A radio transmitter 50 according to the embodiment realizes an APC (Automatic Power Control) function and an AGC (Auto Gain Control) function. Herein, the APC function is a function which adjusts a variation of the transmission power generated due to the circuit concerned, to a predetermined value based on an APC table as will be described hereinafter. On the other hand, the AGC function is a function which adjusts the electric-field intensity at the time of radio communications between the radio transmitter 50 and a base station, to a predetermined value based on an AGC table, as will be described hereinafter.

Namely, in the circuit configuration shown in FIG. 1, I and Q signals express orthogonal signals to be transmitted. An orthogonal modulator 1 carries out an orthogonal modulation processing to the inputted I and Q signals, and thereafter supplies to a driver amplifier 2. The driver amplifier 2 (a first amplifier) amplifies the output signal of the orthogonal modulator 1 according to a gain setting value designated from a base-band circuit 7.

Figure 10:
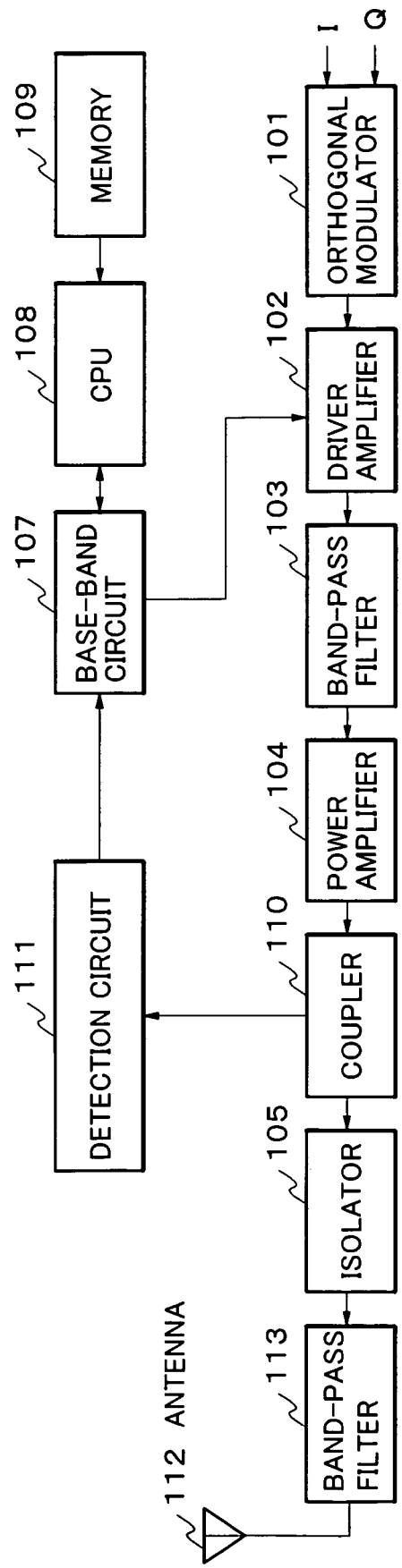
FIG. 10 is a block diagram showing a circuit configuration of a conventional radio transmitter which has an APC function.

The amplified output of the driver amplifier 2 is band-limited in a band-pass filter 3, and thereafter inputted to a power amplifier 4 (a second amplifier). The signal amplified in the power amplifier 4 is, through an isolator 5 and a band-pass filter 13, transmitted from an antenna 10. The isolator 5 suppresses the generating of the characteristic degradation of the power amplifier 4 due to the fact that a part of the output signal of the power amplifier 4 is reflected at the antenna 10. In this embodiment, unlike the conventional radio transmitter (FIG. 10) having the APC function, a coupler is not provided between the power amplifier 4 and the isolator 5.

Moreover, the radio transmitter 50 (FIG. 1) according to this embodiment provides a current detection circuit 6 in order to carry out a signal detection for realizing the APC function: The current detection circuit 6 detects an electric-current which flows to the power amplifier 4. The detection result (the detected electric-current) of the current detection circuit 6 indicates the present transmission power of the power amplifier 4. This detection result is transferred to the CPU (Central Processing Unit: a control circuit) 8 through the base-band circuit 7.

Figure 2:
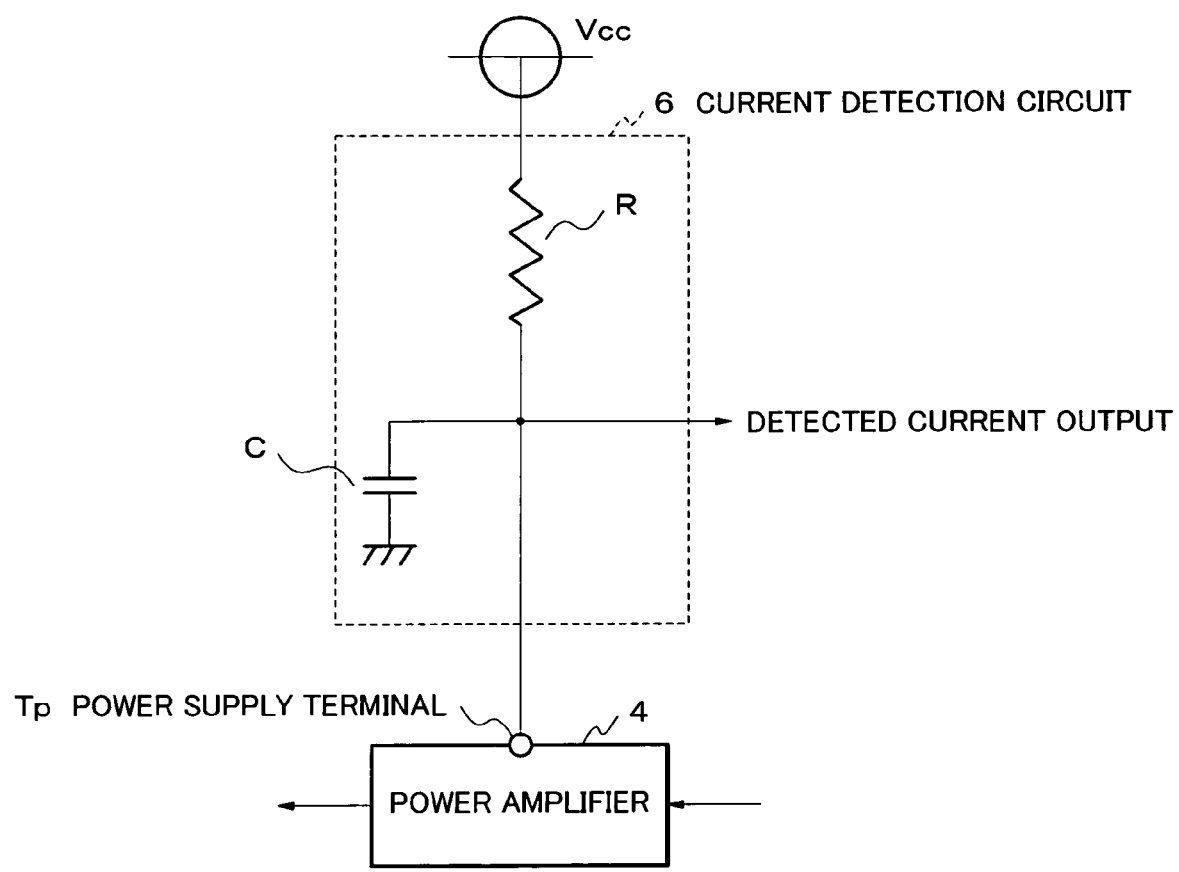
FIG. 2 is a view exemplifying a circuit configuration of a current detection circuit 6 which the radio transmitter (FIG. 1) according to the present embodiment provides.

FIG. 2 is a view illustrating a circuit configuration of the current detection circuit 6 which the radio transmitter (FIG. 1) according to this embodiment provides.

In the current detection circuit 6 shown in FIG. 2, between a power supply terminal Tp of the power amplifier 4 and a power supply voltage vcc, a resistor R is inserted. In this embodiment, an electric-current which flows to the power amplifier 4 from the power supply is detected using a voltage at both ends of this resistor R. The electric-current Icc which flows to the power amplifier 4 can be expressed as the following equation (1):

$$Icc = (Vcc - Vpa)/R \qquad (1),$$

Herein, the voltage VPA is a voltage (the detected current value), which has been detected using the resistor R, corresponding to the present transmission power (the electric-current Icc) of the power amplifier 4.

Incidentally, C is a noise filtering capacitor. Moreover, the current detection circuit 6 shown in FIG. 2 is one example, and may be, for example, a configuration using a current detection element, or may be a circuit configuration wherein the current detection circuit 6 is built-in inside the power amplifier 4.

In this embodiment, in a memory 9, an APC table 9A and an AGC table 9B have been stored in advance. The APC table 9A is a table on which the characteristic between the detected current of the power amplifier 4 and the transmission power of the power amplifier 4 is described. The AGC table 9B is a table on which the characteristic between the transmission power and the AGC (Auto Gain Control) voltage of the driver amplifier 2 is described.

Figure 3:
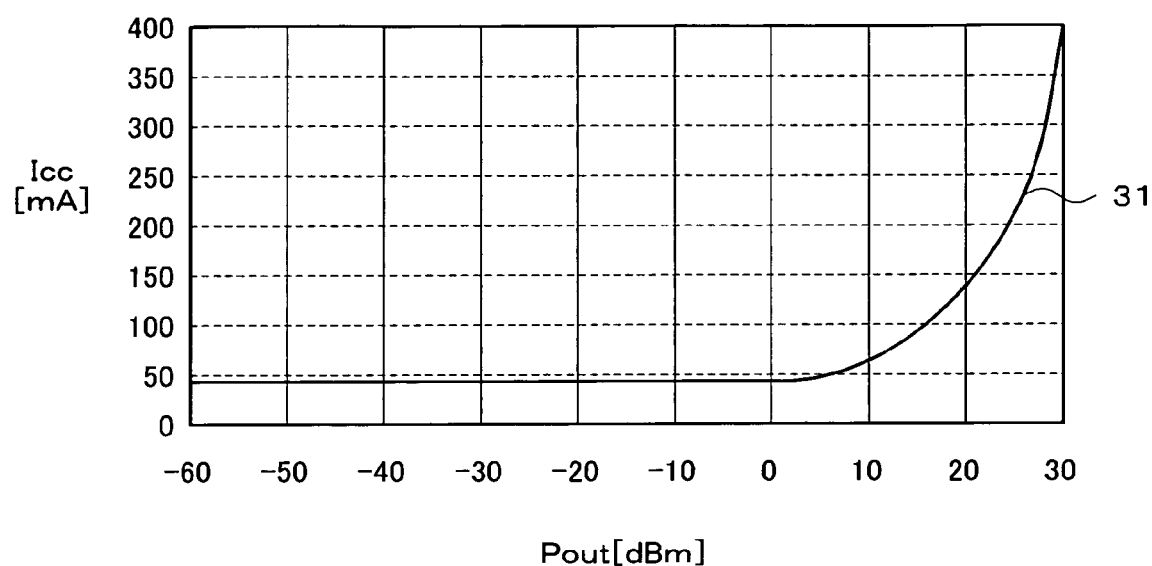
FIG. 3 is a view exemplifying an output (Pout) versus an electric-current (Icc) characteristic of a power amplifier 4 which the radio transmitter (FIG. 1) according to the present embodiment provides.

FIG. 3 is a view exemplifying the characteristic of the output (Pout) versus the electric-current (Icc) of the power amplifier 4 which the radio transmitter (FIG. 1) according to this embodiment provides. Then, FIG. 4 is a view exemplifying the APC table 9A which expresses the characteristic of the output (Pout) versus the electric-current (Icc) of the power amplifier 4.

Figure 7:
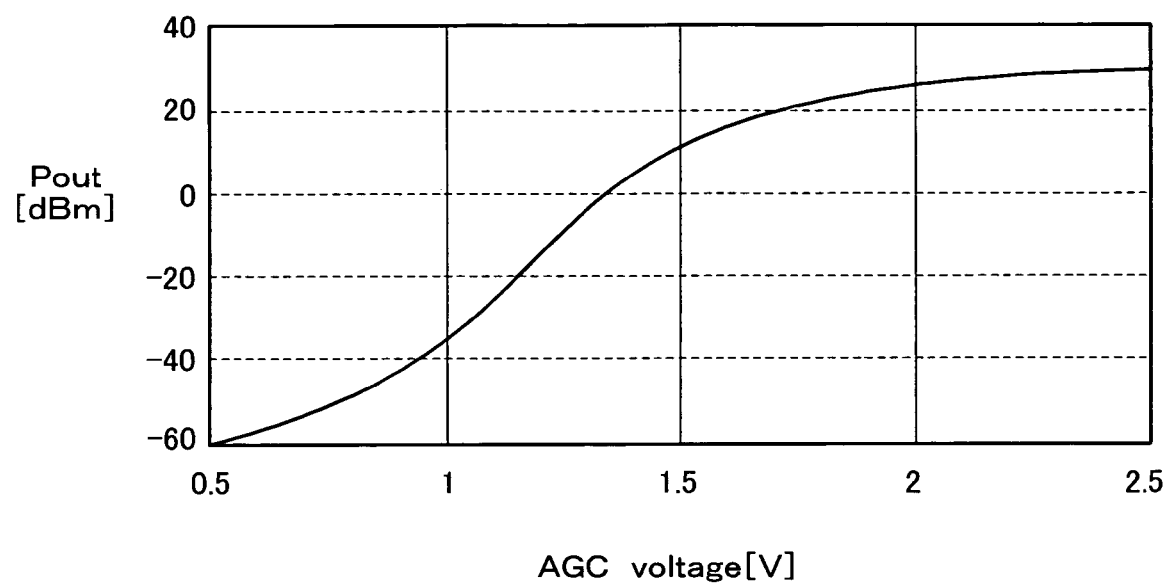
FIG. 7 is a view exemplifying an AGC characteristic between the output power (Pout) of the power amplifier 4, and a control voltage (an AGC voltage) set to a driver amplifier 2 in order to control the gain of the radio transmitter (FIG. 1)

Moreover, FIG. 7 is a view exemplifying the AGC characteristic between the output power (Pout) of the power amplifier 4, and a control voltage (an AGC voltage) set to the driver amplifier 2 in order to control the gain of the radio transmitter (FIG. 1). In the AGC table 9B being stored in the memory 9 in advance, numerical values which express the AGC characteristic shown in FIG. 7 are described in advance.

In the power amplifier 4, for example, as shown by a solid line 31 in FIG. 3, an electric-current corresponding to an output power flows. In this embodiment, based on the output versus the electric-current characteristic shown by the solid line 31, the APC table 9A like the one shown in FIG. 4 has been stored in the memory 9 in advance. Namely, in the APC table 9A, the characteristic between the electric-current which flows to the power amplifier 4 and the output power of the power amplifier 4 has been described.

Then, in this embodiment, the CPU 8 determines a gain which should be set to the control terminal of the driver amplifier 2 by referring to the APC table 9A and the AGC table 9B based on the detected current of the power amplifier 4.

The CPU 8, when the present transmission power of the power amplifier 4 is lower than the originally required transmission power, executes an instruction of increasing the gain of the driver amplifier 2 through the base-band circuit 7, based on the AGC voltage derived from the AGC table 9B. On the contrary, the CPU 8, when the present transmission power of the power amplifier 4 is higher than the originally required transmission power, executes an instruction of decreasing the gain of the driver amplifier 2 through the base-band circuit 7, based on the AGC voltage derived from the AGC table 9B.

More specifically, for example, a case where the transmission power (the target transmission power) which the radio transmitter 50 originally needs is 24.0 dBm, and the current value detected by the current detection circuit 6 is 135.0 mA is considered. In this case, the CPU 8 detects that the present transmission power is 23.0 dBm by referring to the APC table shown in FIG. 4 based on 135.0 mA which is the detected current value. Then, in this case, the CPU 8 compares the present transmission power (23.0 dBm) with the target transmission power (24.0 dBm). Thereby, the CPU 8 recognizes that the present transmission power (23.0 dBm) is lacking (lower) by 1.0 dB against the target transmission power (24.0 dBm). Then, the CPU 8 generates an instruction of increasing the gain of the driver amplifier 2 by 1.0 dB through the base-band circuit 7. At this time, the CPU 8 determines the control voltage (the AGC voltage) which should be specifically set to the control terminal of the driver amplifier 2 by referring to the AGC table 9B on which the AGC characteristics exemplifying in FIG. 7 is described.

Namely, in the example case described above, the CPU 8 ordinarily sets, by referring to the AGC table 9B (the AGC characteristic shown in FIG. 7), the AGC voltage (approximately 1.7 V) for realizing the target transmission power (24.0 dBm) in the power amplifier 4, to the control terminal of the driver amplifier 2. However, the actually detected present transmission power is 23.0 dBm due to the various conditions of the device itself and the environment thereof. Accordingly, in this case, the CPU 8, at first, determines based on the AGC table 9B an offset amount of the AGC voltage required for the transmission power to increase by 1.0 dB which is the above-described difference. Then, the CPU 8 will add the determined offset amount to the AGC voltage (approximately 1.7 V, in this case) which had been set to the power amplifier 4 up to now. More specifically, in the AGC characteristic shown in FIG. 7, when the vertical axis Pout is 23.0 dBm, the horizontal axis AGC voltage is approximately 1.6 V, and is smaller by 0.1 V than the AGC voltage (approximately 1.7 V) which had been set to the power amplifier 4 up to now. Then, the CPU 8 determines such 0.1 V difference to be the above-described offset amount, and determines that this determined offset amount is made the AGC voltage (approximately 1.8 V=1.7+0.1), which is intended to be newly set to the power amplifier 4.

Figure 8:
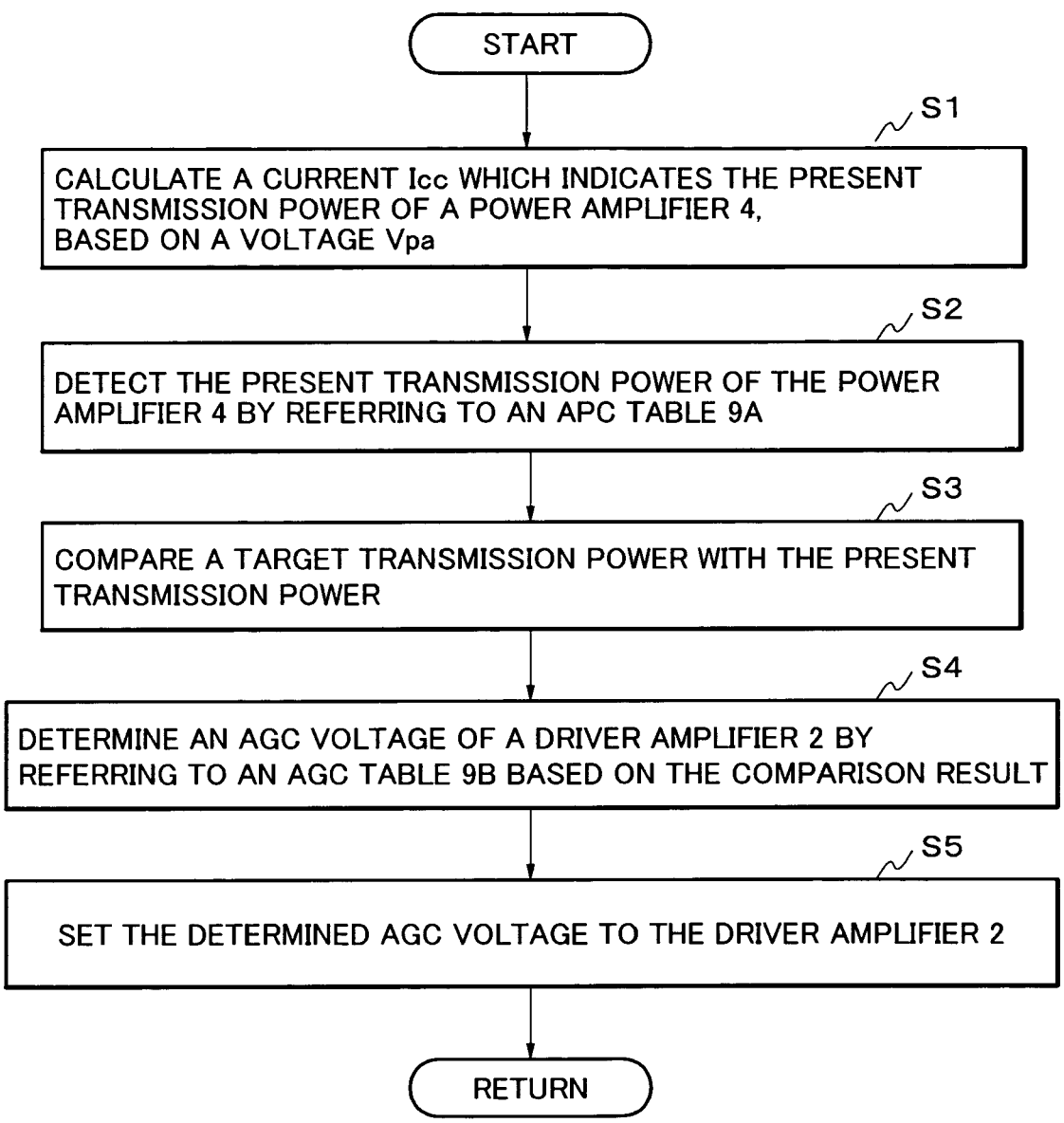
FIG. 8 is a flowchart showing a transmission power control processing in the radio transmitter according to the present embodiment.

The above-described operation of the CPU 8 is realized by the transmission power control processing as will be described hereinafter. FIG. 8 is a flow chart showing the transmission power control processing in the radio transmitter according to this embodiment. The flowchart shows the processing steps of a software program (a transmission power control function 8A) which the CPU 8 performs in the radio transmitter 50 shown in FIG. 1.

In FIG. 8, the CPU 8, at first, calculates the electric-current value Icc by using the above-described equation (1), based on the informed detection result (the voltage Vpa) (step S1). Next, the CPU 8 detects the present transmission power of the power amplifier 4 by referring to the APC table 9A based on the electric-current value Icc (step S2).

The CPU 8 compares the transmission power (the target transmission power), which the device itself originally needs, with the present transmission power which is calculated in the step S2 (step S3).

Next, the CPU 8 refers to the AGC table 9B based on this comparison processing result. Thereby, the CPU 8 determines, following the above-described steps, the AGC voltage of the driver amplifier 2 for adjusting to the transmission power (the target transmission power) which the power amplifier 4 needs (step S4).

Next, the CPU 8 sets the determined AGC voltage to the control terminal of the driver amplifier 2 through the baseband circuit 7 (step S5).

Then, the CPU 8, in the operation of the radio transmitter 50, performs the above-described operation from the step S1 through the step S3 repeatedly.

Effects of the Embodiment

With the device configuration explained above, the radio transmitter 50 according to this embodiment realizes transmission power control to maintain the transmission power to preset target transmission power.

That is, according to this embodiment, as a parameter indicating the present transmission power of the radio transmitter 50, an electric-current which flows to the power amplifier 4 is detected. For this reason, unlike the conventional circuit configuration (FIG. 10) described above, it is not necessary to insert a signal branching circuit for the APC, such as a coupler, between the power amplifier 4 and the isolator 5. Consequently, according to this embodiment, a signal loss caused by inserting such signal branching circuit in the signal transmission line will not be generated. Therefore, this embodiment is suitable because the degradation of RF characteristic will not be invited.

In the above-described APC method described in the Patent Documents 1 and 2, there is provided a circuit configuration wherein the conditions of the power amplifier is detected, while a control signal based on the detected result is feedbacked to the power amplifier itself. On the other hand, the radio transmitter (FIG. 1) according to this embodiment has a circuit configuration which, when an adjustment control (the transmission power control) of the transmission power is carried out, does not control the gain of the power amplifier 4, but controls the gain as the entire device itself by adjusting the AGC voltage of the driver amplifier 2. Then, with such circuit configuration, in this embodiment, the APC function as well as the AGC function is realized.

Namely, in this embodiment, when the APC function is realized, there is no need to provide a terminal for setting the control signal to the power amplifier itself like the APC method according to the Patent Documents 1 and 2. In other words, the circuit configuration for realizing the APC function as well as the AGC function according to this embodiment is highly compatible with the basic circuit configuration of the conventional circuit configuration (FIG. 10) in which the realization of the both functions is also required.

Accordingly, for example, in designing a new radio transmitter, when the circuit configuration (FIG. 1) according to this embodiment is attempted to realize on the basis of such conventional circuit configuration, the control terminal of the driver amplifier (102) can be used as it is in such conventional circuit configuration. Therefore, according to the circuit configuration of this embodiment, a quick product design can be realized and the cost regarding the design and the manufacturing can be reduced.

Furthermore, in this embodiment, the circuit configuration for detecting the transmission power of the power amplifier 4 by the current detection circuit 6 is an extremely simple one, just providing the resistor R for the current detection. Then, the circuit configuration of such current detection circuit 6 is also easy to be integrated with other circuit blocks (for example, an integrated circuit for power supply circuits). For this reason, the circuit configuration can be simplified significantly as compared with the conventional radio transmitter shown in FIG. 10, therefore is suitable also in terms of cost as well as in terms of lightening and miniaturization.

Furthermore, according to this embodiment, there is also an advantage that the APC table 9A can be created easily by measuring the APC characteristic of the power amplifier 4 unit.

Modification of the Embodiment (First Modification)

Figure 9:
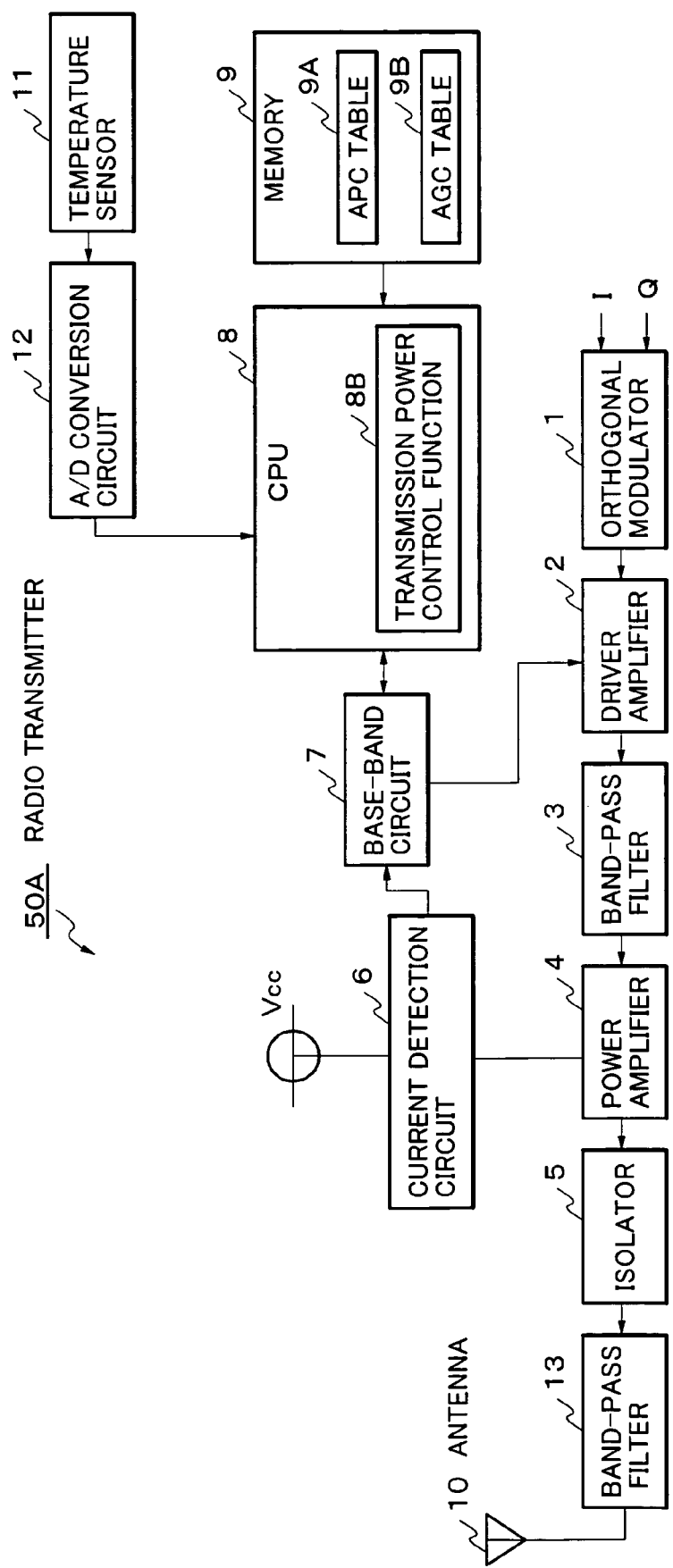
FIG. 9 is a block diagram showing a circuit configuration of a radio transmitter in a first modification of the present embodiment.

FIG. 9 is a block diagram showing a circuit configuration of a radio transmitter in a first modification according to this embodiment. The circuit configuration of a radio transmitter 50A according to this embodiment further provides a temperature sensor 11 and an A (analog)/D (digital) conversion circuit 12 in addition to providing the same configuration as the above-described radio transmitter 50 (FIG. 1). The temperature sensor 11 detects temperatures of the device itself and the environment thereof.

The A/D conversion circuit 12 converts a detection signal detected by the temperature sensor 11 to a digital data. The CPU 8, when a transmission power control function 8B according to this modification is performed, acquires the detection result by the temperature sensor 11 through the A/D conversion circuit 12.

In addition, in the circuit configuration shown in FIG. 9, the duplicating description is omitted by giving the same reference numerals to the same compositions as the above-described embodiment.

Figure 5:
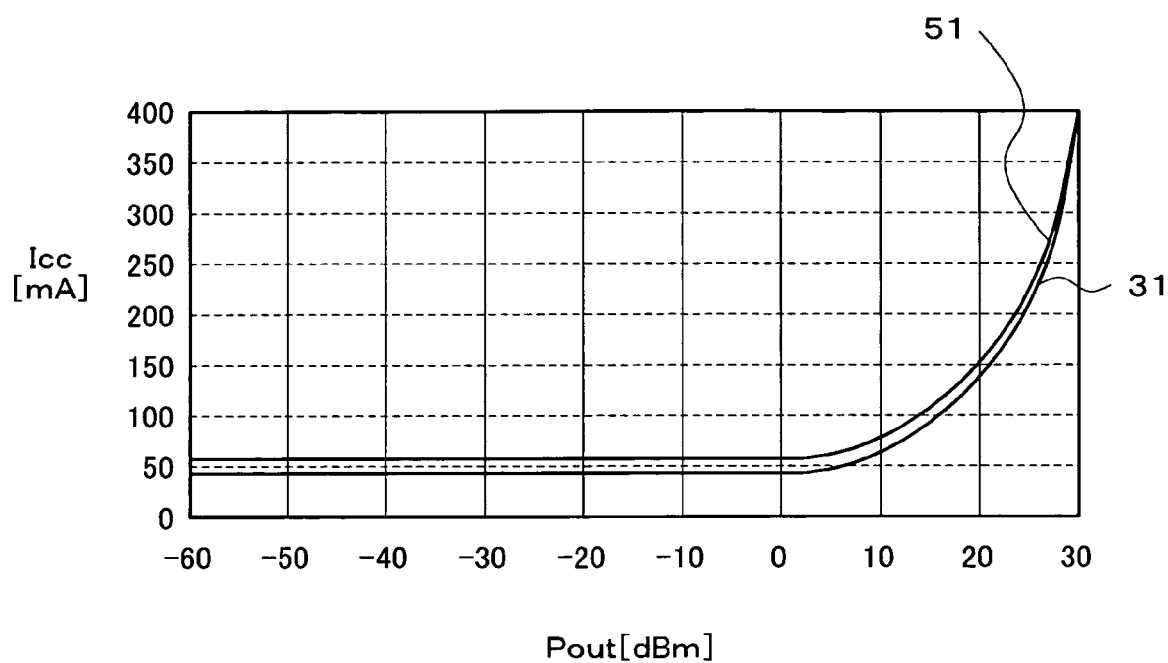
FIG. 5 is a view showing a temperature variation of the output versus the electric-current characteristic of the power amplifier 4.

In the above-described embodiment, it is assumed that there is no change in the characteristic curve (corresponding to the contents of the APC table 9A) exemplified in FIG. 3. However, such characteristic curve actually changes, for example, as shown in FIG. 5, such that a characteristic 31 at room temperature changes as shown like a characteristic 51 due to the influence of temperature changes and the like. For this reason, in the assumed operating temperature range of the radio transmitter 50, in order to realize the most suitable APC function, a plurality of APC tables preferably need to be prepared in advance.

More specifically, it is necessary, for example, to prepare the APC table shown in FIG. 4 at room temperature, the APC table illustrated in FIG. 6A at high temperature, and the APC table exemplified in FIG. 6B at low temperature, and to store these APC tables in the memory 9 in advance. Here, the magnitude relationship in each temperature range of this modification is (low temperature)<(ordinary temperature)< (high temperature), as one example.

And, in this case, the CPU 8 will carry out a processing to suitably switch the APC tables which should be referred to according to the detected temperature. However, as for the memories built in a radio transmitter of a mobile terminal device and the like, the storage capacity thereof is generally restricted. Therefore, also in this case, it is not preferable to store all such plurality of APC tables in the memory 9.

So, in this modification, to each value which constitutes the APC table (FIG. 4) based on the characteristic 31 at the ordinary temperature region, an offset value is prepared in advance for each temperature. Namely, in this modification, the characteristic changes generated in the power amplifier 4 as the temperature changes are stored in the memory 9 in advance as the offset values corresponding to the electric-current values described in the first table (9A), for each temperature detectable by the temperature sensor 11. Accordingly, in this modification, provision is made to enable doping with also the temperature changes sufficiently without increasing the storage capacity which is required for the memory 9.

For example, a case of desiring to obtain output power (target transmission power) of 27.0 dBm will be considered. In this case, the electric-currents in the case of obtaining the output power of 27.0 dBm at each temperature are:

299.0 mA at high temperature (refer to FIG. 6A);
284.0 mA at ordinary temperature (refer to FIG. 4); and
269.0 mA at low temperature (refer to FIG. 6B).

In this modification, the CPU 8 performs the transmission power control function 8B. This transmission power control function 8B has approximately the same processing configuration as the transmission power control processing (FIG. 8), and the content of processing in the step S2 differs due to the relationship of realizing the temperature compensation described above.

Namely, in this modification, the CPU 8, when referring to the APC table 9A in the step S2, also refers to the detected temperature by the temperature sensor 11 (the A/D conversion circuit 12). And, the CPU 8 adds, to the electric-current value Icc obtained from the APC table (FIG. 4) as the reference value, an offset amount corresponding to the detected temperature. And, in this case, the CPU 8 judges that the electric-current value, to which such offset amount is added, is the value indicating the present transmission power.

For example, when the detected temperature is a high temperature, the CPU 8 adds, to the electric-current value Icc obtained from the APC table (FIG. 4), +15 mA (299.0–284.0=15 mA) as an offset amount. On the other hand, when the detected temperature is a low temperature, –15 mA (269.0–284.0=–15 mA: the offset amount) is added to the electric-current value Icc obtained from the APC table (FIG. 4), as an offset amount.

According to such modification, not only the same advantage as the above-described embodiment can be obtained, but further, a temperature-compensated APC function with higher accuracy can be realized. Namely, according to this modification, by a simple processing of adding a preset offset amount for each detection temperature to the electric-current value acquired from the APC table 9A, the characteristic changes of the power amplifier 4 generated by temperature changes and the like can be coped with flexibly.

(Second Modification)

In this modification, to the APC table 9A for the power amplifier 4 and the AGC table 9B for the driver amplifier 2, a linear interpolation is carried out. By carrying out such linear interpolation, fine transmission power control can be realized even in nonlinear portions.

More specifically, the linear interpolation of the APC table 9A and the AGC table 9B means that in regions where the changes occur linearly the interval of sampling values to be described in the table are decimated while in nonlinear regions sampling values to be described in the table are set finely.

Here, one example of the linear interpolation of the APC table 9A in this modification will be described. In the characteristic 31 exemplified in FIG. 3, the region from 5.0 dBm to 20.0 dBm is apparently nonlinear. However, even in this region, looking at a short section (for example, 1 to 4 dBm interval), it can be regarded as linear. So, in this modification, when describing such nonlinear section on the APC table 9A, the interval (a step of 1 to 4 dBm) which can be regarded linear is made. On the other hand, the region from –60 dBm to 5.0 dBm can be regarded as a linear section. Then, in this modification, when describing such linear section on the APC table 9A, a larger interval (a step larger than 4 dBm) is made.

On the other hand, with respect to the AGC table 9B, the setting can be made following the same steps as the above. Namely, in this modification, in the AGC characteristic (FIG. 7) of the driver amplifier 2 which becomes the source of the AGC table 9B, sample values to be described on this table are chosen so as to be at larger intervals in the linear section, and to be at finer intervals in the nonlinear section. In this modification, the AGC table 9B described in such step is referred to at the time of the transmission power control. Thereby, a fine AGC function can be realized, and at the same time the storage area which the AGC table 9B occupies for its own in the memory 9 can be reduced.

In addition, the radio transmitter according to the above-described embodiment and the modification thereof are suitable in applying widely to transmission circuits of general-purpose radio communications apparatus in addition to a mobile terminal device in the mobile communications system.

Moreover, the present invention described as examples of the above-described embodiments and the modification thereof is attained by supplying, to the above-described circuit configuration of the radio transmitter (FIG. 1, FIG. 9), a computer program which can realize the functions of the flowchart (FIG. 8) which has been referred to in the above description, and thereafter by reading out the computer program to the CPU 8 in this apparatus to execute.

Moreover, the computer program supplied inside this apparatus may be stored in the memory 9 or memory devices (not shown).

While this invention has been described in connection with certain preferred embodiments, it is to be understood that the subject matter encompassed by way of this invention is not to be limited to those specific embodiments. On the contrary, it is intended for the subject matter of the invention to include all alternative, modification and equivalents as can be included within the spirit and scope of the following claims.

The invention claimed is:

1. A transmission power control device comprising:
a first amplifier which amplifies power of an inputted transmission signal;
a second amplifier which amplifies an output of said first amplifier; and
a control circuit which adjusts to predetermined target transmission power of the transmission signal by controlling a gain of said first amplifier by comparison of a preferred output value of said second amplifier with an output value of said second amplifier calculated based on an electric-current which flows to said second amplifier from a power supply.

2. The device according to claim 1, further comprising:
a current detection circuit which detects an electric-current flowing to said second amplifier.

3. A radio transmitter, comprising:
said transmission power control device according to claim 1.

4. A transmission power control device comprising:
a first amplifier which amplifies power of an inputted transmission signal;
a second amplifier which amplifies an output of said first amplifier;
a control circuit which adjusts to a predetermined target transmission power of the transmission signal by controlling a gain of said first amplifier based on an electric-current which flows to said second amplifier from a power supply;
a first table on which a characteristic between an electric-current which flows to said second amplifier and the output power of said second amplifier has been stored; wherein:
said control circuit controls the gain of said first amplifier according to the result referred to said first table based on an electric-current which flows to said second amplifier.

5. The device according to claim 4, further comprising:
a second table on which a characteristic between the output power of said second amplifier and a control voltage set to said first amplifier in order to control the gain of the device itself has been stored, wherein:
said control circuit compares the referred result of said first table with said target transmission power, and controls the gain of said first amplifier according to the result referred to said second table based on this comparison result.

6. The device according to claim 5, wherein:
said control circuit is able to refer to, for each detectable temperature, an offset value corresponding to an electric-current value described on said first table, in which the offset value indicates a characteristic change generated in said second amplifier as temperature changes, and
said control circuit, when said first table was referred to based on an electric-current which flows to said second amplifier, adds said offset value corresponding to a detected temperature to the referred result, and controls the gain of said first amplifier according to the referred result to which this offset value was added.

7. The device according to claim 4, wherein:
said control circuit is able to refer to, for each detectable temperature, an offset value corresponding to an electric-current value described on said first table, in which the offset value indicates a characteristic change generated in said second amplifier as temperature changes, and
said control circuit, when said first table was referred to based on an electric-current which flows to said second amplifier, adds said offset value corresponding to a detected temperature to the referred result, and controls the gain of said first amplifier according to the referred result to which this offset value was added.

8. A transmission power control method which adjusts output power of a transmission signal to predetermined target transmission power by amplifying by a first amplifier and a second amplifier to which the output from said first amplifier is inputted, comprising:
detecting an electric-current which flows from a power supply to said second amplifier; and
controlling a gain of said first amplifier by comparison of a preferred output value of said second amplifier with an output value of said second amplifier calculated based on the detected current.

9. A transmission power control method which adjusts output power of a transmission signal to predetermined target transmission power by amplifying by a first amplifier and a second amplifier to which the output from said first amplifier is inputted, comprising:
detecting an electric-current which flows from a power supply to said second amplifier; and
controlling a gain of said first amplifier based on the detected current;
preparing in advance a first table, on which a characteristic between an electric-current which flows to said second amplifier and the output power of said second amplifier is described; and
referring to said first table based on an electric-current which flows to said second amplifier, and controlling the gain of said first amplifier according to the referred result.

10. The method according to claim 9, further comprising:
preparing in advance a second table, on which a characteristic between the output power of said second amplifier and a control voltage set to said first amplifier in order to control the gain of the device itself is described; and
comparing the referred result of said first table with said target transmission power; and
referring to said second table based on this comparison result, and controlling the gain of said first amplifier according to the referred result.

11. The method according to claim 10, further comprising:
preparing in advance a characteristic change generated in said second amplifier as temperature changes, as an offset value corresponding to the electric-current values described on said first table for each detectable temperature; and
when said first table was referred to based on an electric-current which flows to said second amplifier, adding said offset value corresponding to the detected temperature to the referred result, and controlling the gain of said first amplifier according to the referred result to which the offset value was added.

12. The method according to claim 10, further comprising:
   linear-interpolating a characteristic to be described on said second table in advance.

13. The method according to claim 9, further comprising:
   preparing in advance a characteristic change generated in said second amplifier as temperature changes, as an offset value corresponding to the electric-current values described on said first table for each detectable temperature; and
   when said first table was referred to based on an electric-current which flows to said second amplifier, adding said offset value corresponding to the detected temperature to the referred result, and controlling the gain of said first amplifier according to the referred result to which the offset value was added.

14. The method according to claim 9, further comprising:
   linear-interpolating a characteristic to be described on said first table in advance.

15. A transmission power control device comprising:
   a first amplifier which amplifies power of an inputted transmission signal;
   a second amplifier which amplifies an output of said first amplifier; and
   control means for adjusting to predetermined target transmission power of the transmission signal by controlling a gain of said first amplifier by comparison of a preferred output value of said second amplifier with an output value of said second amplifier calculated based on an electric-current which flows to said second amplifier from a power supply.

16. A computer readable medium having stored thereon a computer program for the operation control of a transmission power control device, which adjusts to predetermined target transmission power by amplifying the power of a transmission signal by a first amplifier and a second amplifier to which the output from said first amplifier is inputted, wherein the computer program causes a computer to implement:
   a control function which controls a gain of said first amplifier by comparison of a preferred output value of said second amplifier with an output value of said second amplifier calculated based on an electric-current which flows to said second amplifier from a power supply.

17. The computer readable medium according to claim 16, wherein the computer program causes the computer to implement:
   a referring function which refers to a first table, on which a relationship between an electric-current which flows to said second amplifier and the output power of said second amplifier has been stored, based on the electric-current which flows to said second amplifier; and
   a control function which controls the gain of said first amplifier according to the referred result of said referring function.

18. The computer readable medium according to claim 17, wherein the computer program causes the computer to implement:
   a function which compares the referred result of said first table with said target transmission power; and
   a function which refers to a second table, on which a relationship between the output power of said second amplifier and a control voltage set to said first amplifier in order to control the gain of the device itself has been stored, based on the result of said comparison, wherein:
   said control function controls the gain of said first amplifier according to the referred result of said second table.

* * * * *